US009613581B2

(12) United States Patent
Dai

(10) Patent No.: US 9,613,581 B2
(45) Date of Patent: Apr. 4, 2017

(54) DRIVING CIRCUIT AND LIQUID CRYSTAL DISPLAY APPARATUS HAVING THE SAME

(71) Applicant: SHENZHEN CHINA STAR OPTOELECTRONICS TECHNOLOGY CO., LTD, Shenzhen (CN)

(72) Inventor: Chao Dai, Shenzhen (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 249 days.

(21) Appl. No.: 14/404,637

(22) PCT Filed: Jun. 26, 2014

(86) PCT No.: PCT/CN2014/080841
§ 371 (c)(1),
(2) Date: Dec. 1, 2014

(87) PCT Pub. No.: WO2015/184659
PCT Pub. Date: Dec. 10, 2015

(65) Prior Publication Data
US 2016/0275894 A1    Sep. 22, 2016

(30) Foreign Application Priority Data

Jun. 7, 2014 (CN) .......................... 2014 1 0251234

(51) Int. Cl.
*G09G 3/36* (2006.01)
*G02F 1/133* (2006.01)
(Continued)

(52) U.S. Cl.
CPC ....... *G09G 3/3674* (2013.01); *G02F 1/13306* (2013.01); *G02F 1/136286* (2013.01);
(Continued)

(58) Field of Classification Search
CPC ...... G09G 3/3674; G09G 3/36; G09G 3/3685; G02F 1/13306; G02F 1/136286
See application file for complete search history.

(56) References Cited

U.S. PATENT DOCUMENTS

2005/0030269 A1\*  2/2005  Sekine ................ G09G 3/3614
                                                     345/87
2007/0296682 A1    12/2007  Hwang
(Continued)

FOREIGN PATENT DOCUMENTS

CN    101093649 A    12/2007
CN    101335050 A    12/2008
(Continued)

*Primary Examiner* — Abbas Abdulselam
(74) *Attorney, Agent, or Firm* — Mark M. Friedman

(57) ABSTRACT

A driving circuit and a liquid crystal display apparatus having the same are disclosed. The driving circuit includes a first clock-signal driving circuit, a second clock-signal driving circuit, a data-line driving circuit, and a scanning-line driving circuit. The driving circuit and the liquid crystal display apparatus having the same prevent the delay of primary scanning signals so as to solve a technical problem where conventional liquid crystal display apparatus display images with a low display quality due to the delay of primary scanning signals.

18 Claims, 8 Drawing Sheets

(51) Int. Cl.
*G02F 1/1362* (2006.01)
*G11C 19/28* (2006.01)
*G09G 3/00* (2006.01)

(52) U.S. Cl.
CPC ......... *G09G 3/3677* (2013.01); *G09G 3/3685* (2013.01); *G11C 19/28* (2013.01); *G09G 3/003* (2013.01); *G09G 2300/0447* (2013.01); *G09G 2310/0286* (2013.01); *G09G 2310/08* (2013.01); *G09G 2320/0209* (2013.01); *G09G 2320/0223* (2013.01); *G09G 2320/0233* (2013.01); *G09G 2320/0626* (2013.01)

(56) References Cited

U.S. PATENT DOCUMENTS

| | | | |
|---|---|---|---|
| 2010/0007661 A1* | 1/2010 | Kim | H04N 13/0055 345/419 |
| 2013/0063331 A1 | 3/2013 | Kim et al. | |
| 2013/0264566 A1* | 10/2013 | Umezaki | G09G 3/342 257/43 |
| 2014/0049713 A1* | 2/2014 | No | G02F 1/13306 349/41 |

FOREIGN PATENT DOCUMENTS

| | | |
|---|---|---|
| CN | 103631023 A | 3/2014 |
| JP | 11-259046 A | 9/1999 |

\* cited by examiner

DRIVING CIRCUIT AND LIQUID CRYSTAL DISPLAY APPARATUS HAVING THE SAME

BACKGROUND OF THE INVENTION

Field of the Invention

The present invention relates to the field of liquid crystal display technology, and more particularly to a driving circuit and liquid crystal display apparatus.

Description of the Related Art

With the development of the liquid crystal display technology, more and more users use liquid crystal display apparatuses for social interaction and entertainment. The driving circuit for a traditional liquid crystal display apparatus may apply a GOA (Gate Driver On Array) structure where thin-film transistors of a gate driving circuit are formed on an array substrate, so as to achieve line by line scanning for the gate lines of the driving circuit.

In the meantime, in a conventional large-sized liquid crystal display apparatus, each pixel generally includes a primary sub-pixel and a secondary sub-pixel where the primary sub-pixel and the secondary sub-pixel display the same image with different levels of brightness to achieve multi-domain display for a pixel, thereby solving a color-shifting problem under large view angles existing in a vertical alignment type liquid crystal display device.

In conventional technologies, a gate line (or a primary scanning line) and a corresponding clock signal are used to drive the primary sub-pixel, and a sharing line (or a secondary scanning line) and another corresponding clock signal are used to drive the secondary sub-pixel.

A specific process may be implemented as: when a high-level signal is inputted into the gate line, a corresponding data line then charges a primary liquid crystal capacitor of the primary sub-pixel and a secondary liquid crystal capacitor of the secondary sub-pixel at the same time that the primary sub-pixel and the secondary sub-pixel have the same level of brightness; afterwards, a low-level signal is inputted into the gate line, the corresponding data line then stops charging the liquid crystal capacitors; afterwards, a high-level voltage is inputted into the sharing line, the primary sub-pixel and the secondary sub-pixel then distribute electric charges to the primary liquid crystal capacitor and, the secondary liquid crystal capacitor based on the capacity of a primary storage capacitor of the primary sub-pixel and the capacity of a secondary storage capacitor of the secondary sub-pixel, so that a voltage across ends of the primary liquid crystal capacitor and a voltage across ends of the secondary liquid crystal capacitor are different (generally, the voltage across the ends of the primary liquid crystal capacitor is larger than the voltage across the ends of the secondary liquid crystal capacitor). Thus the primary sub-pixel and the secondary sub-pixel can have different levels of brightness to achieve multi-domain display of pixels.

With reference to FIG. 1, a schematic diagram showing the signal transmission of a driving circuit of a conventional liquid crystal display apparatus, terminals CK1, CK2, CK3, and CK4 each provides a clock signal to a corresponding primary scanning line and a corresponding secondary scanning line through a GOA (Gate Driver on Array) of a scanning-line driving circuit, wherein the terminal STV provides a driving start signal and a driving stop signal.

During the operation of the driving circuit, since the clock signal for driving the primary scanning line and the clock signal for driving the secondary scanning line are the same, the resistance of the primary scanning line and the resistance of the secondary scanning line will have influence on the clock signal, thereby resulting in signal delay to a certain degree when producing a primary scanning signal according to the clock signal, and thus affecting the display quality of the liquid crystal display apparatus.

Therefore, it is necessary to provide a driving circuit and a liquid crystal display apparatus having the same to overcome the problems existing in the conventional technology.

SUMMARY OF THE INVENTION

An object of the present invention is to provide a driving circuit and a liquid crystal display apparatus having the same so as to solve a technical problem where conventional liquid crystal display apparatus display images with a low display quality due to the delay of the driving signal on a primary scanning line.

In order to achieve the foregoing object, the technical solutions of the present invention are as follows:

An embodiment of the present invention provides a driving circuit which is mounted in a liquid crystal display apparatus, wherein the liquid crystal display apparatus includes a liquid crystal display panel and a driving circuit; the liquid crystal display panel has a plurality of data lines, a plurality of scanning lines, and a plurality of pixel units defined by the intersected data lines and scanning lines; each one of the pixel units includes a primary pixel and a secondary pixel; the plurality of scanning lines are divided into a plurality of primary scanning lines and a plurality of secondary scanning lines; wherein the driving circuit has:

a first clock-signal driving circuit for generating a first clock signal;

a second clock-signal driving circuit for generating a second clock signal;

a data-line driving circuit for generating a data signal and transmitting the data signal to the corresponding signal line; and a scanning-line driving circuit for generating a primary scanning signal according to the first clock signal and transmitting the primary scanning signal to the corresponding primary scanning line, and for generating a secondary scanning signal according to the second clock signal and transmitting the secondary scanning signal to the corresponding secondary scanning line;

the frequency of the second clock signal is higher than that of the first clock signal; wherein the scanning-line driving circuit further includes:

a primary-scanning-signal generating module for generating a present-stage primary scanning signal according to the first clock signal and a previous-stage primary cascade connection signal;

a primary-cascade-connection-signal generating module for generating a present-stage primary cascade connection signal;

a primary driving stop module for stopping generating the present-stage primary scanning signal according to a next-stage primary scanning signal; and a primary-scanning-signal maintaining module for maintaining a low electric potential of the present-stage primary scanning signal; wherein the scanning-line driving circuit further includes:

a secondary-scanning-signal generating module for generating a present-stage secondary scanning signal according to the second clock signal and a previous-stage secondary cascade connection signal;

a secondary-cascade-connection-signal generating module for generating a present-stage secondary cascade connection signal;

a secondary driving stop module for stopping generating the present-stage secondary scanning signal according to the next-stage secondary scanning signal; and a secondary-scanning-signal maintaining module for maintaining a low electric potential of the present-stage secondary scanning signal.

In the foregoing driving circuit of the present invention, when the liquid crystal display apparatus is displaying a three-dimensional image, the second clock-signal driving circuit generates a constant low level signal so that the primary pixel and the secondary pixel have the same brightness level.

The present invention further provides another driving circuit which is mounted in a liquid crystal display apparatus, wherein the liquid crystal display apparatus includes a liquid crystal display panel and a driving circuit; the liquid crystal display panel has a plurality of data lines, a plurality of scanning lines, and a plurality of pixel units defined by the intersected data lines and scanning lines; each one of the pixel units includes a primary pixel and a secondary pixel; the plurality of scanning lines are divided into a plurality of primary scanning lines and a plurality of secondary scanning lines; wherein the driving circuit has:

a first clock-signal driving circuit for generating a first clock signal;

a second clock-signal driving circuit for generating a second clock signal;

a data-line driving circuit for generating a data signal and transmitting the data signal to the corresponding signal line; and a scanning-line driving circuit for generating a primary scanning signal according to the first clock signal and transmitting the primary scanning signal to the corresponding scanning line, and for generating a secondary scanning signal according to the second clock signal and transmitting the secondary scanning signal to the corresponding secondary scanning line.

In the foregoing driving circuit of the present invention, when the liquid crystal display apparatus is displaying a three-dimensional image, the second clock-signal driving circuit generates a constant low level signal so that the primary pixel and the secondary pixel have the same brightness level.

In the foregoing driving circuit of the present invention, the driving circuit further has:

a first startup circuit for generating a first start signal and a first stop signal; wherein the first start signal and the first stop signal are used for the scanning-line driving circuit to generate the primary scanning signal; and a second startup circuit for generating a second start signal and a second stop signal; wherein the second start signal and the second stop signal are used for the scanning-line driving circuit to generate the secondary scanning signal.

In the foregoing driving circuit of the present invention, when the liquid crystal display apparatus is displaying a three-dimensional image, the second startup circuit does not generate the second start signal and the second stop signal.

In the foregoing driving circuit of the present invention, the scanning-line driving circuit further has:

a primary-scanning-signal generating module for generating a present-stage primary scanning signal according to the first clock signal and a previous-stage primary cascade connection signal;

a primary-cascade-connection-signal generating module for generating a present-stage primary cascade connection signal;

a primary driving stop module for stopping the present-stage primary scanning signal according to a next-stage primacy scanning signal; and a primary-scanning-signal maintaining module for maintaining a low electric potential of the present-stage primary scanning signal.

In the foregoing driving circuit of the present invention, the primary driving stop module stops the present-stage primary scanning signal by pulling down the electric potential of the present-stage primary scanning signal.

In the foregoing driving circuit of the present invention, the scanning-line driving circuit further has:

a secondary-scanning-signal generating module for generating a present-stage secondary scanning signal according to the second clock signal and a previous-stage secondary cascade connection signal;

a secondary-cascade-connection-signal generating module for generating a present-stage secondary cascade connection signal;

a secondary driving stop module for stopping generating the present-stage secondary scanning signal according to the next-stage secondary scanning signal; and a secondary-scanning-signal maintaining module for maintaining a low electric potential of the present-stage secondary scanning signal.

In the foregoing driving circuit of the present invention, the secondary driving stop module stops the present-stage secondary scanning signal by pulling down the electric potential of the present-stage secondary scanning signal.

The present invention further provides a liquid crystal display apparatus which includes a liquid crystal display panel and a driving circuit, wherein the liquid crystal display panel has a plurality of data lines, a plurality of scanning lines, and a plurality of pixel units defined by the intersected data lines and scanning lines; each one of the pixel units includes a primary pixel and a secondary pixel; the plurality of scanning lines are divided into a plurality of primary scanning lines and a plurality of secondary scanning lines; wherein the driving circuit has:

a first clock-signal driving circuit for generating a first clock signal;

a second clock-signal driving circuit for generating a second clock signal;

a data-line driving circuit for generating a data signal and transmitting the data signal to the corresponding signal line; and a scanning-line driving circuit for generating a primary scanning signal according to the first clock signal and transmitting the primary scanning signal to the corresponding scanning line, and for generating a secondary scanning signal according to the second clock signal and transmitting the secondary scanning signal to the corresponding secondary scanning line.

In the foregoing liquid crystal display apparatus of the present invention, the frequency of each of the second clock signal is higher than that of each of the first clock signal.

In the foregoing liquid crystal display apparatus of the present invention, when the liquid crystal display apparatus is displaying a three-dimensional image, the second clock-signal driving circuit generates a constant low level signal so that the primary pixel and the secondary pixel have the same brightness level.

In the foregoing liquid crystal display apparatus of the present invention, the driving circuit further includes:

a first startup circuit for generating a first start signal and a first stop signal; wherein the first start signal and the first stop signal are used for the scanning-line driving circuit to generate the primary scanning signal; and a second startup circuit for generating a second start signal and a second stop signal; wherein the second start signal and the second stop signal are used for the scanning-line driving circuit to generate the secondary scanning signal.

In the foregoing liquid crystal display apparatus of the present invention, when the liquid crystal display apparatus is displaying a three-dimensional image, the second startup circuit does not generate the second start signal and the second stop signal.

In the foregoing liquid crystal display apparatus of the present invention, the scanning-line driving circuit further has:

a primary-scanning-signal generating module for generating a present-stage primary scanning signal according to the first clock signal and a previous-stage primary cascade connection signal;

a primary-cascade-connection-signal generating module for generating a present-stage primary cascade connection signal;

a primary driving stop module for stopping the present-stage primary scanning signal according to a next-stage primary scanning signal; and a primary-scanning-signal maintaining module for maintaining a low electric potential of the present-stage primary scanning signal.

In the foregoing liquid crystal display apparatus of the present invention, the primary driving stop module stops the present-stage primary scanning signal by pulling down the electric potential of the present-stage primary scanning signal.

In the foregoing liquid crystal display apparatus of the present invention, the scanning-line driving circuit further has:

a secondary-scanning-signal generating module for generating a present-stage secondary scanning signal according to the second clock signal and a previous-stage secondary cascade connection signal;

a secondary-cascade-connection-signal generating module for generating a present-stage secondary cascade connection signal;

a secondary driving stop module for stopping generating the present-stage secondary scanning signal according to the next-stage secondary scanning signal; and a secondary-scanning-signal maintaining module for maintaining a low electric potential of the present-stage secondary scanning signal.

In the foregoing liquid crystal display apparatus of the present invention, the secondary driving stop module stops the present-stage secondary scanning signal by pulling down the electric potential of the present-stage secondary scanning signal.

Compared with the conventional liquid crystal display apparatus and the driving circuit thereof, the driving circuit of the present invention generates a primary scanning signal according to a first clock signal and generates a second scanning signal according to a second clock signal, thereby preventing the delay of the primary scanning signal and then solving a technical problem where conventional liquid crystal display apparatus display images with a low display quality due to the delay of primary scanning signals.

In order to make the contents of the present invention more easily understood, the preferred embodiments of the present invention are described in detail, in cooperation with accompanying drawings, as follows:

DETAILED DESCRIPTION OF THE PREFERRED EMBODIMENTS

Figure 1:
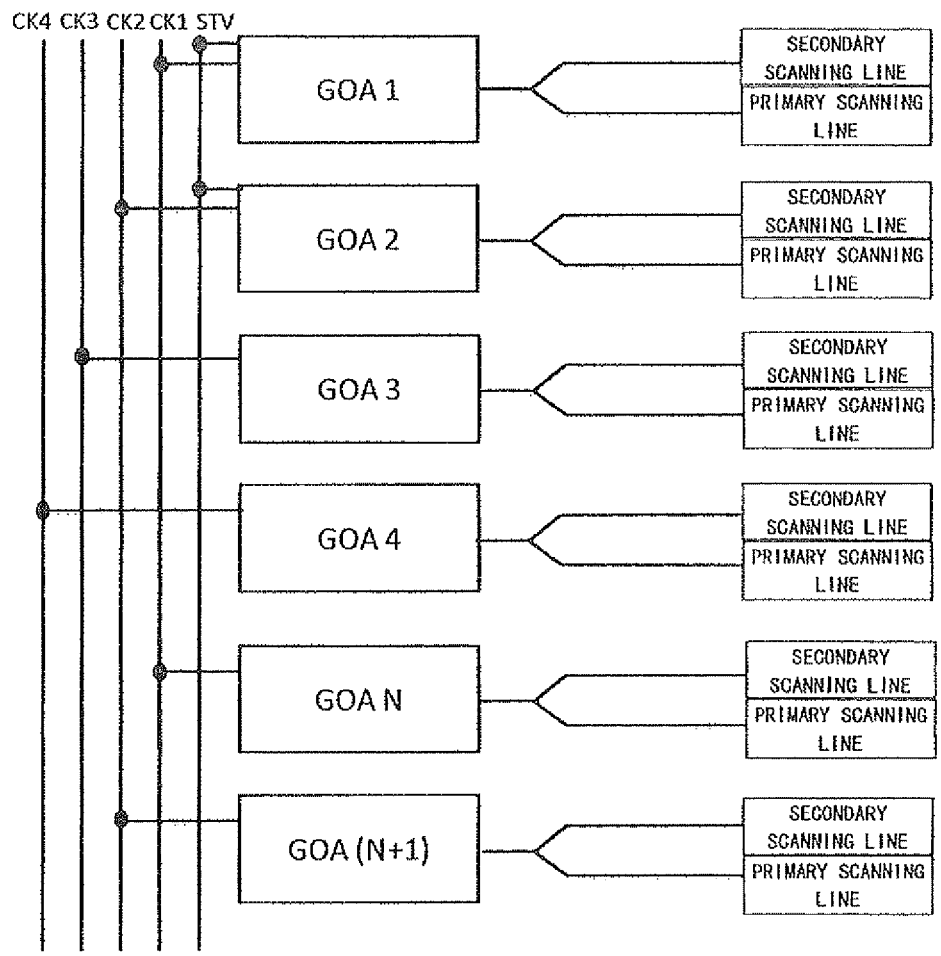
FIG. 1 is a schematic diagram showing the signal transmission of a driving circuit of a conventional liquid crystal display apparatus.

The following description of each embodiment is referring to the accompanying drawings so as to illustrate practicable specific embodiments in accordance with the present invention. The directional terms described in the present invention, such as upper, lower, front, rear, left, right, inner, outer, side, etc., are only directions referring to the accompanying drawings, so that the used directional terms are used to describe and understand the present invention, but the present invention is not limited thereto.

In the drawings, members with similar structures may be labeled with the same reference characters.

Figure 2:
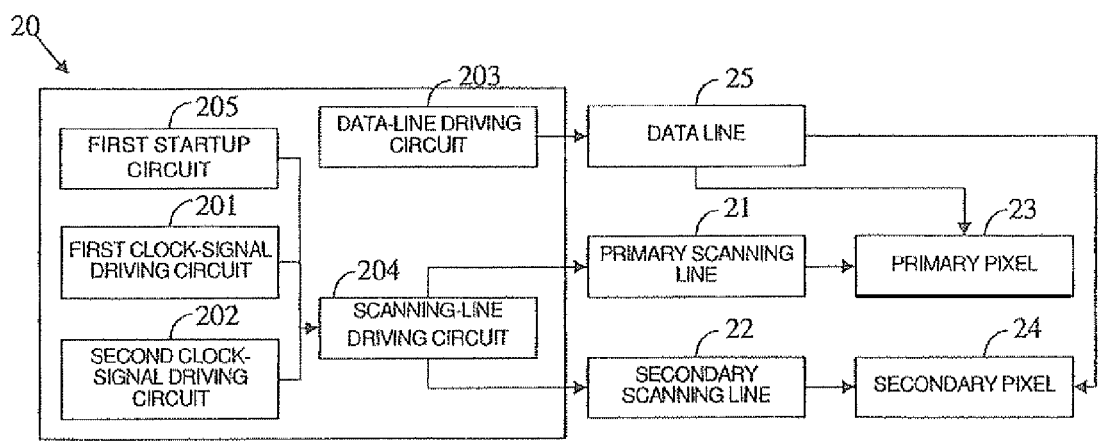
FIG. 2 is a block diagram of a driving circuit of a liquid crystal display apparatus according to a first embodiment of the present invention.

Please refer to FIG. 2, which is a block diagram of a driving circuit of a liquid crystal display apparatus according to a first embodiment of the present invention. The liquid crystal display apparatus comprises a liquid crystal display panel and a driving circuit 20. The liquid crystal display panel includes a plurality of data lines 25, a plurality of scanning lines, and a plurality of pixel units defined by the intersected data lines 25 and scanning lines. Each one of the pixel units includes a primary pixel 23 and a secondary pixel 24, and the plurality of scanning lines are divided into a plurality of primary scanning lines 21 and a plurality of secondary scanning lines 22.

The driving circuit 20 includes a first clock-signal driving circuit 201, a second clock-signal driving circuit 202, a data-line driving circuit 203, a scanning-line driving circuit 204, and a first startup circuit 205. The first clock-signal driving circuit 201 is used to generate a first clock signal. The second clock-signal driving circuit 202 is used to generate a second clock signal. The data-line driving circuit 203 is used to generate a data signal and transmit the data signal to the corresponding data line 25. The scanning-line driving circuit 204 is used to generate a primary scanning signal according to the first clock signal and transmit the primary scanning signal to the corresponding primary scanning line 21, and to generate a secondary scanning signal according to the second clock signal and transmit the secondary scanning signal to the corresponding secondary scanning line 22. The first startup circuit 205 is used to generate a first start signal and a first stop signal, wherein the first start signal and the first stop signal are used for the scanning-line driving circuit 204 to decide whether to generate the primary scanning signal and the secondary scanning signal. The scanning-line driving circuit 204, in each frame, generates the primary scanning signal and the secondary scanning signal according to the first start signal, and stops generating the primary scanning signal and the secondary scanning signal according to the first stop signal.

Figure 3:
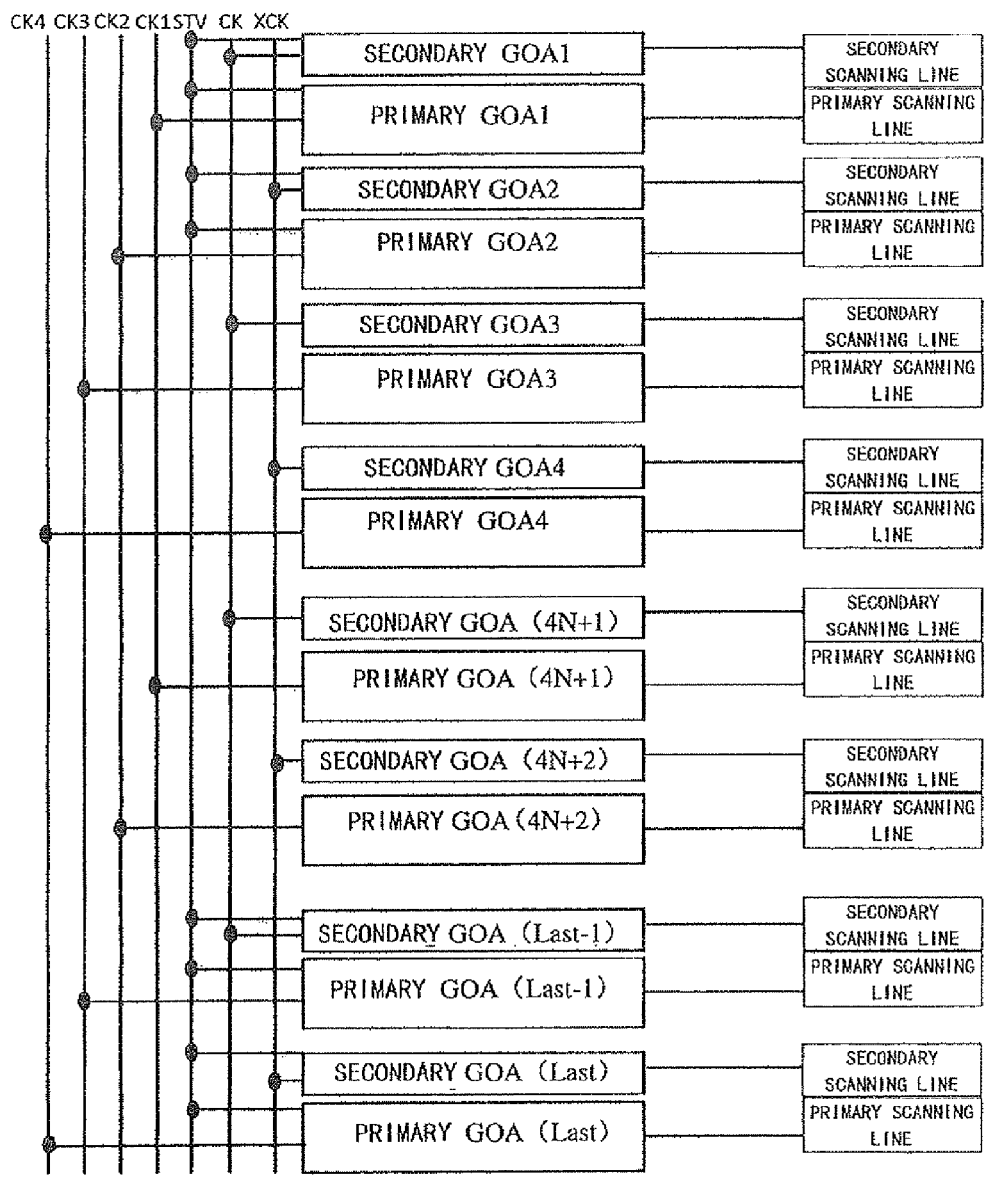
FIG. 3 is a schematic diagram showing the signal transmission of the driving circuit of the liquid crystal display apparatus according to the first embodiment of the present invention.
Figure 4:
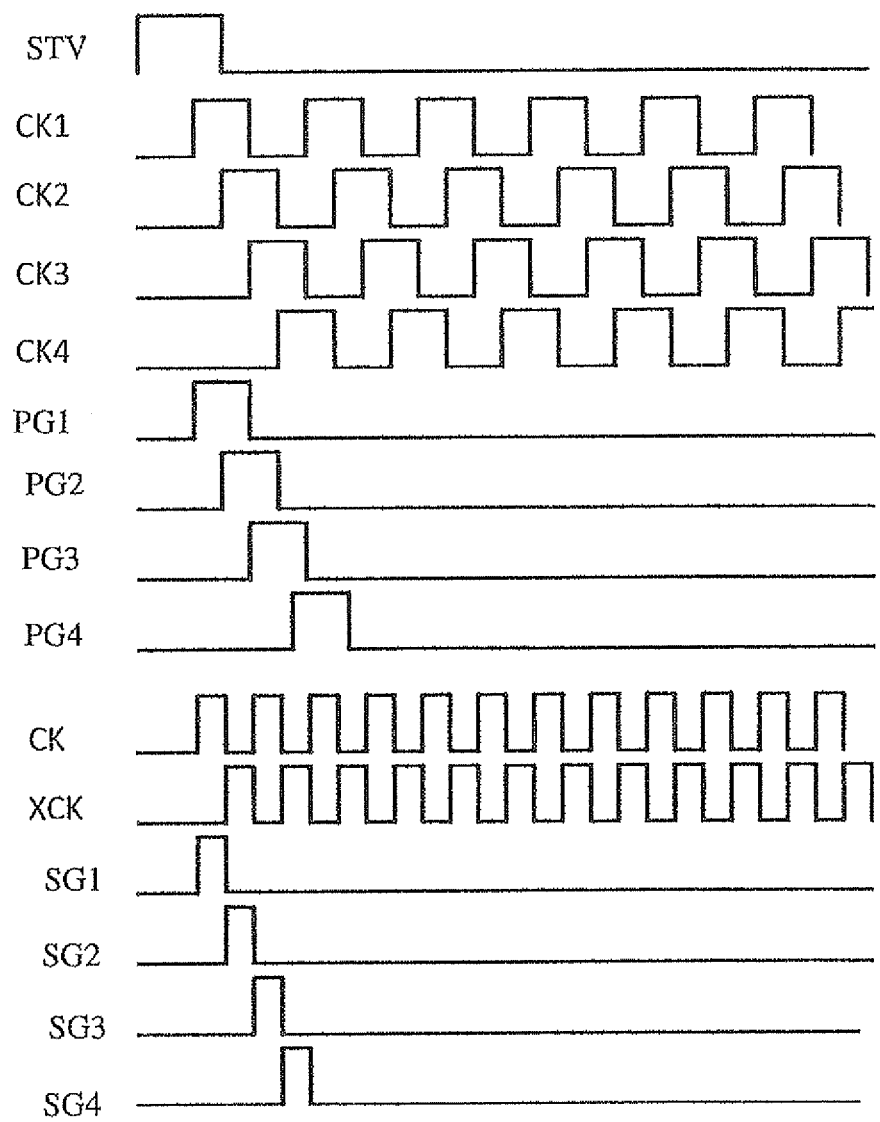
FIG. 4 is a timing diagram of the driving circuit of the liquid crystal display apparatus according to the first embodiment of the present invention.

The driving circuit 20 of the present embodiment can better prevent the primary scanning signal from being affected by the RC load in the pixels. Please refer to FIGS. 3 and 4 where FIG. 3 is a schematic diagram showing signal transmission of the driving circuit of the liquid crystal display apparatus according to the first embodiment and FIG. 4 is a timing diagram of the driving circuit of the liquid crystal display apparatus according to the first embodiment of the present invention.

The first clock-signal driving circuit 201 of the driving circuit generates a first clock signal CK1, a first clock signal CK2, a first clock signal CK3, and a first clock signal CK4; and the second clock-signal driving circuit 202 generates a second clock signal CK and a second clock signal XCK. The first startup circuit 205 generates a first start signal STV and a first stop signal (not shown in the figure). The number of the first clock signals may be decided according to the design of the liquid crystal display panel and the load. The second clock signal may be two high-frequency clock signals with opposite phrases.

The term "GOA" hereinafter means a so-called gate driver on array. The first clock signal CK1 is inputted into a primary GOA1 (or a primary GOA (4N+1)) of the scanning-line driving circuit 204, the primary GOA1 (or the primary GOA (4N+1)) then generates a primary scanning signal PG1 (or a primary scanning signal PG (4N+1)) and then transmits it to the corresponding primary scanning line 21 so as to control the corresponding primary pixel 23 and the secondary pixel 24 which are disposed on the first row (or the $(4N+1)_{th}$ row) to receive a corresponding data signal, respectively.

The first clock signal CK2 is inputted into a primary GOA2 (or a primary GOA(4N+2)) of the scanning-line driving circuit 204. The primary GOA2 (or the primary GOA(4N+2)) then generates a primary scanning signal PG2 (or a primary scanning signal PG(4N+2)), and then transmits it to the corresponding primary scanning line 21 so as to control the corresponding primary pixel 23 and the secondary pixel 24 which are disposed on the second row (or the $(4N+2)_{th}$ row) to receive a corresponding data signal, respectively.

The first clock signal CK3 is inputted into a primary GOA3 (or a primary GOA(4N+3)) of the scanning-line driving circuit 204. The primary GOA3 (or the primary GOA(4N+3)) then generates a primary scanning signal PG3 (or a primary scanning signal PG(4N+3)), and then transmits it to the corresponding primary scanning line 21 so as to control the corresponding primary pixel 23 and the secondary pixel 24 which are disposed on the third row (or the $(4N+3)_{th}$ row) to receive a corresponding data signal, respectively.

The first clock signal CK4 is inputted into a primary GOA4 (or a primary GOA(4N+4)) of the scanning-line driving circuit 204. The primary GOA4 (or the primary GOA(4N+4)) then generates a primary scanning signal PG4 (or a primary scanning signal PG(4N+4)), and then transmits it to the corresponding primary scanning line 21 so as to control the corresponding primary pixel 23 and the secondary pixel 24 which are disposed on the fourth row (or the $(4N+4)_{th}$ row) to receive a corresponding data signal, respectively.

The second clock signal CK is inputted into a secondary GOA1 (or a secondary GOA(2N+1)) of the scanning-line driving circuit 204. The secondary GOA1 (or the secondary GOA(2N+1)) then generates a secondary scanning signal SG1 (or a secondary scanning signal SG(2N+1)), and then transmits it to the corresponding secondary scanning line 21 so as to redistribute the electric charges of a liquid crystal capacitor of the secondary pixel 24 on the first row (or the $(2N+1)_{th}$ row) and the electric charges of a liquid crystal capacitor of the primary pixel 23 on the first row (or the $(2N+1)_{th}$ row), such that the primary pixel 23 and the secondary pixel 24 on the first row (or the $(2N+1)_{th}$ row) perform different levels of brightness.

The second clock signal CKX is inputted into a secondary GOA2 (or a secondary GOA(2N+2)) of the scanning-line driving circuit 204. The secondary GOA2 (or the secondary GOA(2N+2)) then generates a secondary scanning signal SG2 (or a secondary scanning signal SG(2N+2)), and then transmits it to the corresponding secondary scanning line 21 so as to redistribute the electric charges of a liquid crystal capacitor of the secondary pixel 24 on the second row (or the $(2N+2)_{th}$ row) and the electric charges of a liquid crystal capacitor of the primary pixel 23 on the first row (or the $(2N+1)_{th}$ row), such that the primary pixel 23 and the secondary pixel 24 on the second row (or the $(2N+2)_{th}$ row) perform different levels of brightness.

The first start signal STV of the first startup circuit 205 is inputted into the primary GOA1 and the secondary GOA1 that control the scanning signals on the first row of pixel units and the primary GOA2 and the secondary GOA2 that control the scanning signals on the second row of pixel units in the scanning-line driving circuit 204. The first stop signal STV of the first startup circuit 205 is inputted into the primary GOA(last) and the secondary GOA(last) that control the scanning signals on the last row of pixel units and the primary GOA(last−1) and the secondary GOA(last−1) that control the scanning signals on the second to last row of pixel units.

In the driving circuit 20 of the present preferred embodiment, the frequency of the second clock signal is higher than that of the first clock signal.

When the driving circuit 20 of the present invention drives the liquid crystal display apparatus to perform two-dimensional display, the first startup circuit 205 first sends the first start signal STV to the scanning-line driving circuit 204. Since the scanning-line driving circuit 204 to which each row of pixel units corresponds will generate a cascade connection signal for driving the next row of pixel units, the first start signals STV in this embodiment only need to be inputted into the primary GOA1 and the secondary GOA1 that control the first row of pixel units and the primary GOA2 and the secondary GOA2 that control the second row of pixel units. Similarly, the first stop signal STV sent by the first startup circuit 205 will also only need to be inputted into the primary GOA(last) and the secondary GOA(last) that control the last row of pixel units, and the primary GOA (last−1) and the secondary GOA(last−1) that control the second to last row of pixel units.

After the scanning-line driving circuit 204 of the driving circuit 20 is activated, in order to achieve a multi-domain display on the primary pixel 23 and the secondary pixel 24, the scanning-line driving circuit 204 then uses the second clock signal with higher frequency to generate a secondary scanning signal, and uses the first clock signal with lower frequency to generate a primary scanning signal. Thus, the secondary scanning signal is independently controlled by the second clock signal, and will not be affected by the resistance of the primary scanning line 21; and the primary scanning signal is independently controlled by the first clock signal, and will not be affected by the resistance of the secondary scanning line 22, thereby enormously reducing the delay of the primary scanning signal on the primary scanning line 21 and the secondary scanning signal on the secondary scanning line 22.

With reference to FIG. 4, the first startup circuit 205 first sends the first start signal STV to the scanning-line driving circuit 204, the scanning-line driving circuit 204 then starts to receive the first clock signal CK1, the first clock signal CK2, first clock signal CK3, and the first clock signal CK4 generated by the first clock-signal driving circuit 201. The primary scanning signal P01, the primary scanning signal PG2, the primary scanning signal PG3, and the primary scanning signal PG4 then are generated one after another by the primary GOA of the scanning-line driving circuit 204. Finally, the first startup circuit 205 sends the first stop signal STV (not shown in the figure) to the scanning-line driving circuit 204 so that the scanning-line driving circuit 204 accordingly stops receiving the first clock signal generated by the first clock-signal driving circuit 204, thus stopping the scanning-line driving circuit 204 from generating the primary scanning signal.

In the meantime, according to the first start signal STV, the scanning-line driving circuit 204 starts to receive the second clock signal CK and the second clock signal XCK generated by the second clock-signal driving circuit 202. The secondary scanning signal SG1, the secondary scanning signal SG2, the secondary scanning signal SG3, and the secondary scanning signal SG4 then are generated one after another by the secondary GOA of the scanning-line driving circuit 204. Finally, the first startup circuit 205 sends the first stop signal STY (not shown in the figure) to the scanning-line driving circuit 204 so that that the scanning-line driving circuit 204 stops receiving the second clock signal generated by the second clock-signal driving circuit 202, thus stopping the scanning-line driving circuit 204 from generating the secondary scanning signal.

When the driving circuit 20 of the present embodiment is being used to drive the liquid crystal display apparatus to perform three-dimensional display, in order to prevent that there is a huge difference in brightness between the primary pixel 23 and the secondary pixel 24 which may result in a crosstalk phenomenon between left-eye images and right-eye images, the second clock-signal driving circuit 202 may generate a constant low level signal, meaning the scanning-line driving circuit 204 will not generate the secondary scanning signal, such that the electric charges in the primary liquid crystal capacitor and in the secondary liquid crystal capacitor will not be redistributed. Therefore, the primary pixel 23 and the secondary pixel 24 can have the same brightness level so as to avoid the occurrence of the crosstalk phenomenon.

After finishing the foregoing steps, the driving process of the liquid crystal display apparatus of the first embodiment then is completed.

In conclusion, the driving circuit of the present preferred embodiment generates the primary scanning signal according to the first clock signal and generates the secondary scanning signal according to the second clock signal in such a way that the delay of the primary scanning signal is prevented.

Figure 5:
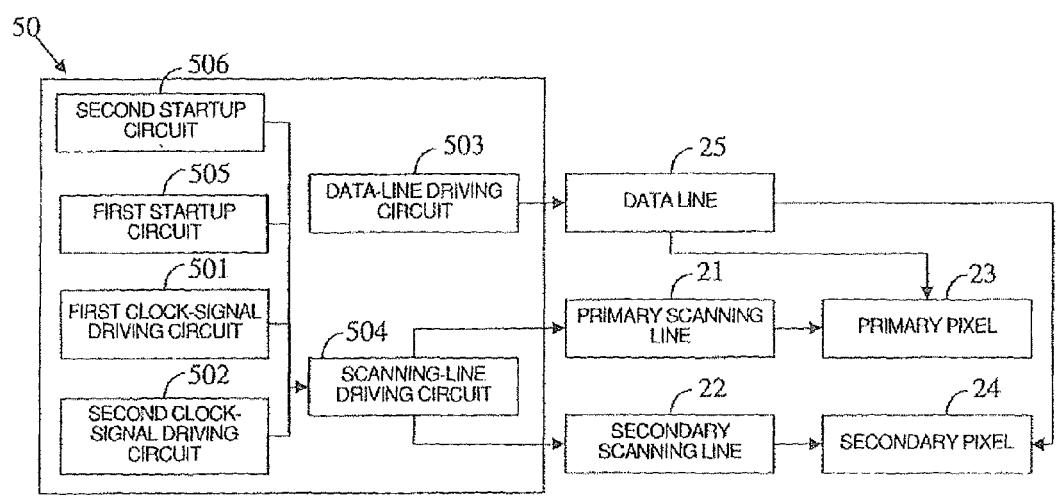
FIG. 5 is a block diagram of a driving circuit of a liquid crystal display apparatus according to a second embodiment of the present invention.

Please refer to FIG. 5, which is a block diagram of a driving circuit of a liquid crystal display apparatus according to a second embodiment of the present invention. The driving circuit 50 includes a first clock-signal driving circuit 501, a second clock-signal driving circuit 502, a data-line driving circuit 503, a scanning-line driving circuit 504, a first startup circuit 505 and a second startup circuit 506. This embodiment is different from the foregoing first embodiment in that, the first startup circuit 505 is used to generates a first start signal and a first stop signal, wherein the first start signal and the first stop signal are used for the scanning-line driving circuit 504 to generate a primary scanning signal. The second startup circuit 506 is used to generates a second start signal and a second stop signal, wherein the second start signal and the second stop signal are used for the scanning-line driving circuit 504 to generate a secondary scanning signal.

Figure 6:
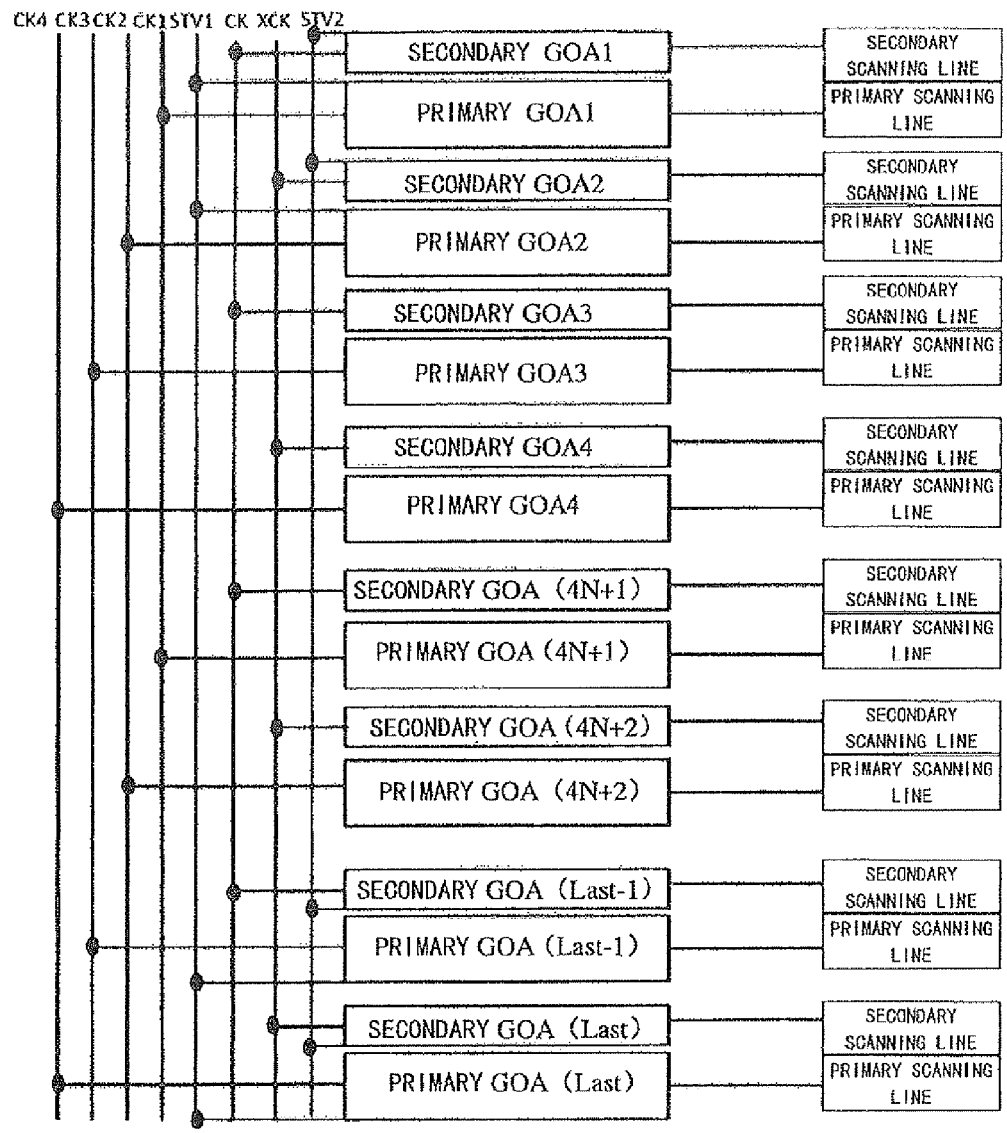
FIG. 6 is a schematic diagram showing the signal transmission of the driving circuit of the liquid crystal display apparatus according to the second embodiment of the present invention.
Figure 7:
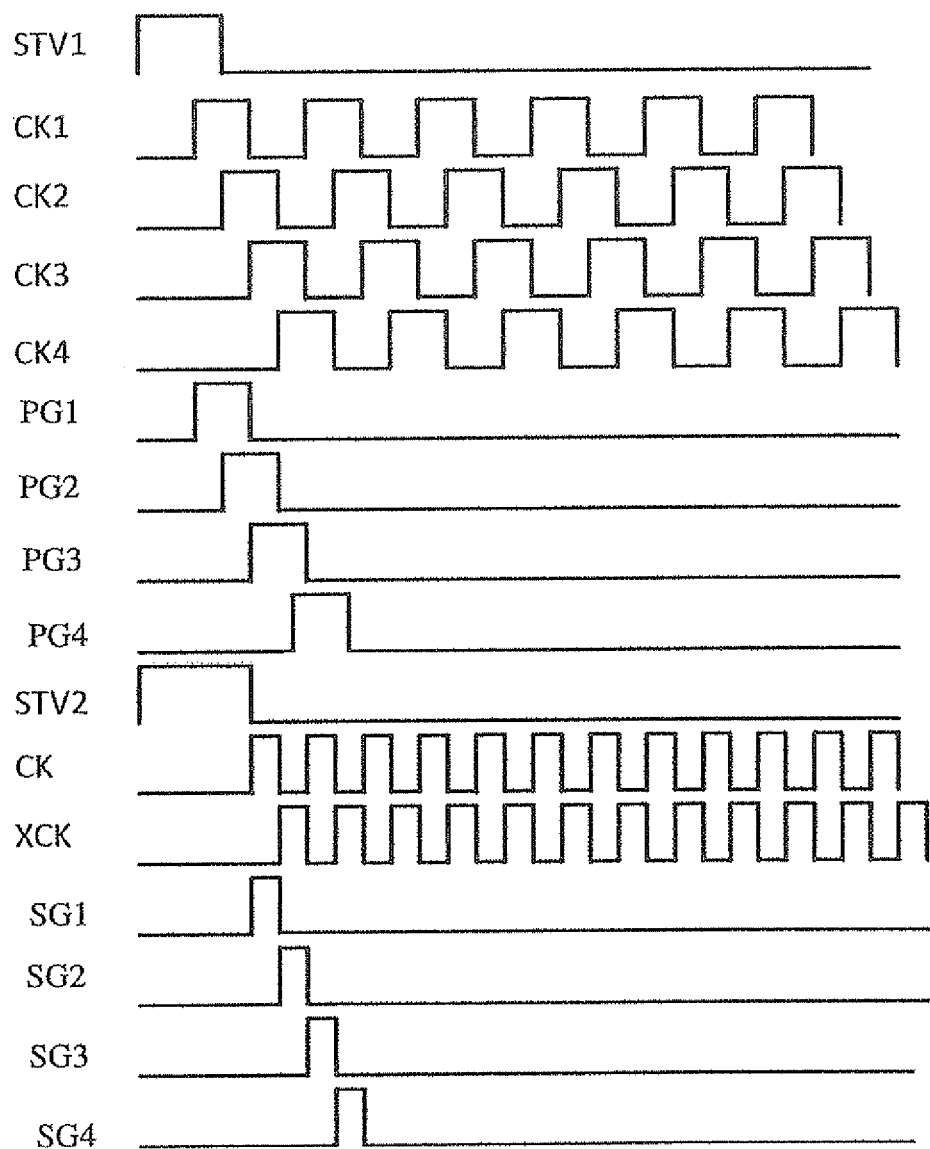
FIG. 7 is a timing diagram of the driving circuit of the liquid crystal display apparatus according to the second embodiment of the present invention.

Please refer to FIG. 6 and FIG. 7 where FIG. 6 is a schematic diagram showing the signal transmission of the driving circuit of the liquid crystal display apparatus according to the second embodiment of the present invention; FIG. 7 is a timing diagram of the driving circuit of the liquid crystal display apparatus according to the second embodiment of the present invention.

The process of the driving circuit 50 of the present embodiment driving the liquid crystal display apparatus to perform two-dimensional display is different from that of the foregoing first embodiment in that: the scanning-line driving circuit 504, according to the first start signal STV1, starts to receive the first clock signal generated by the first clock-signal driving circuit 501, and stops receiving the first clock signal generated by the first clock-signal driving circuit 501 according to the first stop signal STV1; and the scanning-line driving circuit 504, according to the second start signal STV2, starts to receive, and stops receiving the second clock signal generated by the second clock-signal driving circuit 502 according to the second stop signal STV2.

When the driving circuit 50 of the present embodiment is driving the liquid crystal display apparatus to perform three-dimensional display, in order to prevent that there is a huge difference in brightness between the primary pixel 23 and the secondary pixel 24 which may result in a crosstalk phenomenon between left-eye images and right-eye images, the second startup circuit 206 does not generate the second start signal and the second stop signal, meaning that the second startup circuit 206 is turned off. Thus, the scanning-line driving circuit 504 will not receive the second clock signal, and therefore will not send any secondary scanning signals, such that the electric charges in the primary liquid crystal capacitor and the secondary liquid crystal capacitor of the pixel units will not be redistributed. Therefore, the primary pixel 23 and the secondary pixel 24 can have the same brightness level so as to avoid the occurrence of the crosstalk phenomenon.

The driving process of the liquid crystal display apparatus of the second embodiment then is completed.

Thus, in conclusion, the driving circuit of the present preferred embodiment generates the primary scanning signal according to the first clock signal and generates the secondary scanning signal according to the second clock signal so that the delay of the primary scanning signal is prevented.

Preferably, the scanning-line driving circuit of the present preferred embodiment includes a primary-scanning-signal generating module, a primary-cascade-connection-signal generating module, and a primary driving stop module. The primary-scanning-signal generating module is used to generate a present-stage primary scanning signal according to the first clock signal and a previous-stage primary cascade connection signal; the primary-cascade-connection-signal generating module is used to generate the present-stage primary cascade connection signal; and the primary driving stop module is used to stop the present-stage primary scanning signal according to the primary scanning signal of next stage. Specifically, the action of stopping the present-stage primary scanning signal may be pulling down the electric potential of the present-stage primary scanning signal.

Preferably, the scanning-line driving circuit of the present preferred embodiment further includes a secondary-scanning-signal generating module, secondary-cascade-connection-signal generating module, and a secondary driving stop module. The secondary-scanning-signal generating module is used to generate a present-stage secondary scanning signal according to the second clock signal and a previous-stage secondary cascade connection signal; the secondary-cascade-connection-signal generating module is used to generate a present-stage secondary scanning signal; the secondary driving stop module is used to stop the present-stage secondary scanning signal according to the secondary scanning signal of next stage. Specifically, the action of stopping the present-stage secondary scanning signal may be pulling down the electric potential of the present-stage secondary scanning signal.

Figure 8:
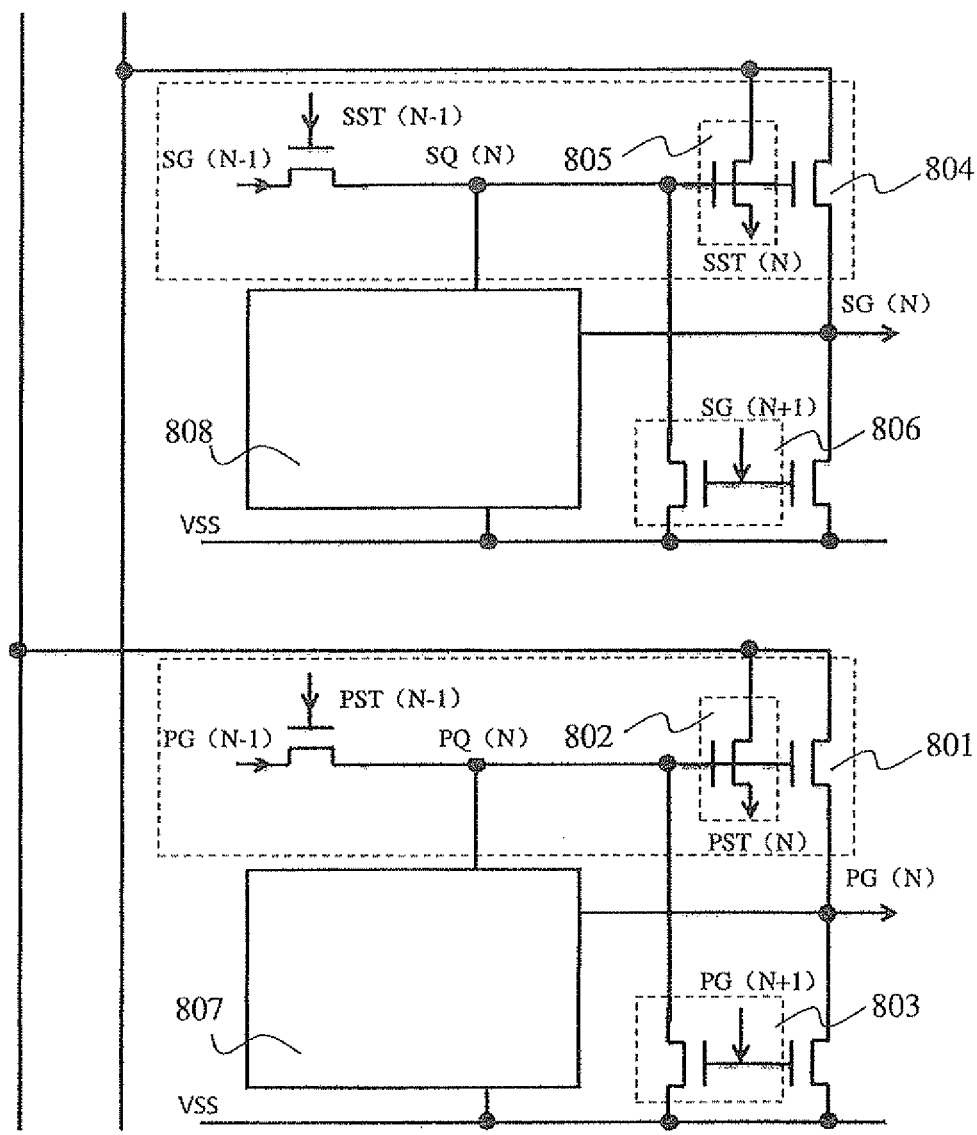
FIG. 8 is a schematic diagram of a scanning-line driving circuit of the driving circuit of the liquid crystal display apparatus according to an embodiment of the present invention.

Please refer to FIG. 8, which is a schematic diagram of a scanning-line driving circuit of the driving circuit of the liquid crystal display apparatus according to an embodiment of the present invention.

In the FIG. 8, the reference character 801 refers to the primary-scanning-signal generating module. The primary-scanning-signal generating module 801 generates a present-stage primary scanning signal PG(N) according to a first clock signal CKn, a previous-stage primary cascade connection signal PST(N−1), and a previous-stage primary scanning signal PG(N−1). The reference character 802 refers to the primary-cascade-connection-signal generating module, which generates a present-stage primary cascade connection signal PST(N) also according to the first clock signal CKn, the previous-stage primary cascade connection signal PST(N−1), and the previous-stage primary scanning signal PG(N−1). The reference character 803 refers to the primary driving stop module, which stops the present-stage primary scanning signal PG(N) according to a next-stage primary scanning signal PG(N+1) by pulling down the electric potential of PQ(N) and the electric potential of PG(N).

The reference character 804 refers to the secondary-scanning-signal generating module. The secondary-scanning-signal generating module 804 generates a present-stage secondary scanning signal SON according to a second clock signal CK or XCK, a previous-stage secondary cascade connection signal SST(N−1), and a previous-stage secondary scanning signal SG(N−1). The reference character 805 refers to the secondary-cascade-connection-signal generating module which generates a present-stage secondary cascade connection signal SSTN also according to the second clock signal CK or XCK, the previous-stage secondary cascade connection signal SST(N−1), and the previous-stage secondary scanning signal SG(N−1), and transmits the present-stage secondary cascade connection signal SSTN to the next stage. The reference character 806 refers to the secondary driving stop module which stops the present-stage secondary scanning signal according to the next-stage secondary scanning signal SG(N+1) by pulling down the electric potential of the present-stage secondary scanning signal SG(N) and the electric potential of SQ(N).

In a preferred embodiment, the scanning-line driving circuit may further include a primary-scanning-signal maintaining module 807 and a secondary-scanning-signal maintaining module 808. The primary-scanning-signal maintaining module 807 is used to maintain the low electric potential of PQ(N) and PG(N). The secondary-scanning-signal maintaining module 808 is used to maintain the low electric potential of SQ(N) and SG(N).

The present further provides a liquid crystal display apparatus which includes the foregoing driving circuit, and the working principle of the liquid crystal display apparatus is the same as that of the driving circuit, and can be understood by the related description of the foregoing embodiments.

The driving circuit and the liquid crystal display apparatus of the present invention generate the primary scanning signal according to the first clock signal and generate the secondary scanning signal according the second clock signal so as to prevent the delay of the primary scanning signals, thereby solving a technical problem where conventional liquid crystal display apparatus display images with a low display quality due to the delay of primary scanning signals.

The present invention uses a first insulating layer with different thicknesses so that the liquid crystal display apparatus can display images with an even brightness level, thereby solving the technical problem where the image displayed by conventional liquid crystal devices has an uneven brightness level or the conventional liquid crystal devices have a lower aperture rate.

The present invention has been described with preferred embodiments thereof, and it is understood that many changes and modifications to the described embodiment can be carried out without departing from the scope and the spirit of the invention that is intended to be limited only by the appended claims.

What is claimed is:

1. A driving circuit for being mounted in a liquid crystal display apparatus, wherein the liquid crystal display apparatus includes a liquid crystal display panel and a driving circuit, wherein the liquid crystal display panel includes a plurality of data lines, a plurality of scanning lines, and a plurality of pixel units defined by the intersected data lines and scanning lines; each one of the pixel units includes a primary pixel and a secondary pixel; the plurality of scanning lines are divided into a plurality of primary scanning lines and a plurality of secondary scanning lines; wherein the driving circuit comprises:

a first clock-signal driving circuit for generating a first clock signal;

a second clock-signal driving circuit for generating a second clock signal;

a data-line driving circuit for generating a data signal and transmitting the data signal to the corresponding signal line; and a scanning-line driving circuit for generating a primary scanning signal according to the first clock signal and transmitting the primary scanning signal to the corresponding primary scanning line, and for generating a secondary scanning signal according to the second clock signal and transmitting the secondary scanning signal to the corresponding secondary scanning line; the frequency of the second clock signal is higher than that of the first clock signal; wherein the scanning-line driving circuit further includes:
a primary-scanning-signal generating module for generating a present-stage primary scanning signal according to the first clock signal and a previous-stage primary cascade connection signal;
a primary-cascade-connection-signal generating module for generating a present-stage primary cascade connection signal;
a primary driving stop module for stopping generating the present-stage primary scanning signal according to a next-stage primary scanning signal; and
a primary-scanning-signal maintaining module for maintaining a low electric potential of the present-stage primary scanning signal; wherein the scanning-line driving circuit further includes:
a secondary-scanning-signal generating module for generating a present-stage secondary scanning signal according to the second clock signal and a previous-stage secondary cascade connection signal;
a secondary-cascade-connection-signal generating module for generating a present-stage secondary cascade connection signal;
a secondary driving stop module for stopping generating the present-stage secondary scanning signal according to the next-stage secondary scanning signal; and
a secondary-scanning-signal maintaining module for maintaining a low electric potential of the present-stage secondary scanning signal.

2. The driving circuit as claimed in claim 1, wherein when the liquid crystal display apparatus is displaying a three-dimensional image, the second clock-signal driving circuit generates a constant low level signal so that the primary pixel and the secondary pixel have the same brightness level.

3. A driving circuit for being mounted in a liquid crystal display apparatus, wherein the liquid crystal display apparatus includes a liquid crystal display panel and a driving circuit, wherein the liquid crystal display panel includes a plurality of data lines, a plurality of scanning lines, and a plurality of pixel units defined by the intersected data lines and scanning lines; each one of the pixel units includes a primary pixel and a secondary pixel; the plurality of scanning lines are divided into a plurality of primary scanning lines and a plurality of secondary scanning lines; wherein the driving circuit comprises:
a first clock-signal driving circuit for generating a first clock signal;
a second clock-signal driving circuit for generating a second clock signal;
a data-line driving circuit for generating a data signal and transmitting the data signal to the corresponding signal line; and
a scanning-line driving circuit for generating a primary scanning signal according to the first clock signal and transmitting the primary scanning signal to the corresponding scanning line, and for generating a secondary scanning signal according to the second clock signal and transmitting the secondary scanning signal to the corresponding secondary scanning line; wherein the scanning-line driving circuit further comprises:

a primary-scanning-signal generating module for generating a present-stage primary scanning signal according to the first clock signal and a previous-stage primary cascade connection signal;
a primary-cascade-connection-signal generating module for generating a present-stage primary cascade connection signal;
a primary driving stop module for stopping the present-stage primary scanning signal according to a next-stage primary scanning signal; and
a primary-scanning-signal maintaining module for maintaining a low electric potential of the present-stage primary scanning signal.

4. The driving circuit as claimed in claim 3, wherein the frequency of the second clock signal is higher than that of the first clock signal.

5. The driving circuit as claimed in claim 3, wherein when the liquid crystal display apparatus is displaying a three-dimensional image, the second clock-signal driving circuit generates a constant low level signal so that the primary pixel and the secondary pixel have the same brightness level.

6. The driving circuit as claimed in claim 3, wherein the driving circuit further comprises:
a first startup circuit for generating a first start signal and a first stop signal; wherein the first start signal and the first stop signal are used for the scanning-line driving circuit to generate the primary scanning signal; and
a second startup circuit for generating a second start signal and a second stop signal; wherein the second start signal and the second stop signal are used for the scanning-line driving circuit to generate the secondary scanning signal.

7. The driving circuit as claimed in claim 6, wherein when the liquid crystal display apparatus is displaying a three-dimensional image, the second startup circuit does not generate the second start signal and the second stop signal.

8. The driving circuit as claimed in claim 3, wherein the primary driving stop module stops the present-stage primary scanning signal by pulling down the electric potential of the present-stage primary scanning signal.

9. The driving circuit as claimed in claim 3, wherein the scanning-line driving circuit further comprises:
a secondary-scanning-signal generating module for generating a present-stage secondary scanning signal according to the second clock signal and a previous-stage secondary cascade connection signal;
a secondary-cascade-connection-signal generating module for generating a present-stage secondary cascade connection signal;
a secondary driving stop module for stopping generating the present-stage secondary scanning signal according to the next-stage secondary scanning signal; and
a secondary-scanning-signal maintaining module for maintaining a low electric potential of the present-stage secondary scanning signal.

10. The driving circuit as claimed in claim 9, wherein the secondary driving stop module stops the present-stage secondary scanning signal by pulling down the electric potential of the present-stage secondary scanning signal.

11. A liquid crystal display apparatus comprising a liquid crystal display panel and a driving circuit, wherein the liquid crystal display panel includes a plurality of data lines, a plurality of scanning lines and a plurality of pixel units defined by the intersected data lines and scanning lines; each one of the pixel units includes a primary pixel and a secondary pixel; the plurality of scanning lines are divided into a plurality of primary scanning lines and a plurality of secondary scanning lines; wherein the driving circuit comprises:
- a first clock-signal driving circuit for generating a first clock signal;
- a second clock-signal driving circuit for generating a second clock signal;
- a data-line driving circuit for generating a data signal and transmitting the data signal to the corresponding signal line; and
- a scanning-line driving circuit for generating a primary scanning signal according to the first clock signal and transmitting the primary scanning signal to the corresponding scanning line, and for generating a secondary scanning signal according to the second clock signal and transmitting the secondary scanning signal to the corresponding secondary scanning line; wherein
the scanning-line driving circuit further comprises:
- a primary-scanning-signal generating module for generating a present-stage primary scanning signal according to the first clock signal and a previous-stage primary cascade connection signal;
- a primary-cascade-connection-signal generating module for generating a present-stage primary cascade connection signal;
- a primary driving stop module for stopping the present-stage primary scanning signal according to a next-stage primary scanning signal; and
- a primary-scanning-signal maintaining module for maintaining a low electric potential of the present-stage primary scanning signal.

12. The liquid crystal display apparatus as claimed in claim 11, wherein the frequency of each of the second clock signal is higher than that of each of the first clock signal.

13. The liquid crystal display apparatus as claimed in claim 11, wherein when the liquid crystal display apparatus is displaying a three-dimensional image, the second clock-signal driving circuit generates a constant low level signal so that the primary pixel and the secondary pixel have the same brightness level.

14. The liquid crystal display apparatus as claimed in claim 11, wherein the driving circuit further includes:
- a first startup circuit for generating a first start signal and a first stop signal; wherein the first start signal and the first stop signal are used for the scanning-line driving circuit to generate the primary scanning signal; and
- a second startup circuit for generating a second start signal and a second stop signal; wherein the second start signal and the second stop signal are used for the scanning-line driving circuit to generate the secondary scanning signal.

15. The liquid crystal display apparatus as claimed in claim 14, wherein when the liquid crystal display apparatus is displaying a three-dimensional image, the second startup circuit does not generate the second start signal and the second stop signal.

16. The liquid crystal display apparatus as claimed in claim 11, wherein the primary driving stop module stops the present-stage primary scanning signal by pulling down the electric potential of the present-stage primary scanning signal.

17. The liquid crystal display apparatus as claimed in claim 11, wherein the scanning-line driving circuit further comprises:
- a secondary-scanning-signal generating module for generating a present-stage secondary-scanning signal according to the second clock signal and a previous-stage secondary cascade connection signal;
- a secondary-cascade-connection-signal generating module for generating a present-stage secondary cascade connection signal;
- a secondary driving stop module for stopping generating the present-stage secondary scanning signal according to the next-stage secondary scanning signal; and
- a secondary-scanning-signal maintaining module for maintaining a low electric potential of the present-stage secondary scanning signal.

18. The liquid crystal display apparatus as claimed in claim 17, wherein the secondary driving stop module stops the present-stage secondary scanning signal by pulling down the electric potential of the present-stage secondary scanning signal.

* * * * *